United States Patent
Kim

(10) Patent No.: US 7,875,843 B2
(45) Date of Patent: Jan. 25, 2011

(54) COLOR FILTERS AND METHOD OF FABRICATING THE SAME IN IMAGE SENSOR

(75) Inventor: Sang-Chul Kim, Eumseong-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 204 days.

(21) Appl. No.: 12/203,183

(22) Filed: Sep. 3, 2008

(65) Prior Publication Data

US 2009/0065684 A1    Mar. 12, 2009

(30) Foreign Application Priority Data

Sep. 7, 2007    (KR)    ................. 10-2007-0090947

(51) Int. Cl.
*G01J 3/50*    (2006.01)
(52) U.S. Cl. .................. 250/226; 257/98; 257/294; 438/70
(58) Field of Classification Search .............. 250/226; 257/98, 294, E31.12; 438/70
See application file for complete search history.

(56) References Cited

U.S. PATENT DOCUMENTS

| | | | | |
|---|---|---|---|---|
| 5,631,753 | A * | 5/1997 | Hamaguchi et al. | 349/110 |
| 6,251,700 | B1 * | 6/2001 | Lin et al. | 438/70 |
| 6,507,083 | B1 * | 1/2003 | Tian | 257/432 |
| 7,084,056 | B2 * | 8/2006 | Won | 438/627 |
| 7,235,833 | B2 * | 6/2007 | Chen | 257/294 |
| 7,390,686 | B2 * | 6/2008 | Lim | 438/57 |
| 2006/0014314 | A1 * | 1/2006 | Yaung et al. | 438/69 |
| 2007/0052053 | A1 * | 3/2007 | Lee | 257/462 |

* cited by examiner

*Primary Examiner*—Seung C Sohn
(74) *Attorney, Agent, or Firm*—Sherr & Vaughn, PLLC

(57) ABSTRACT

An image sensor and a method for fabricating the same having enhanced sensivity. The image sensor enhances sensitivity and minimizes optical loss by isolating color filters from each other using a metal that has superior light reflection properties while having no effect on the color filters during deposition of the metal.

12 Claims, 2 Drawing Sheets

COLOR FILTERS AND METHOD OF FABRICATING THE SAME IN IMAGE SENSOR

The present application claims priority under 35 U.S.C. §119 to Korean Patent Application No. 10-2007-0090947 (filed on Sep. 7, 2007), which is hereby incorporated by reference in its entirety.

BACKGROUND

Image sensors are devices for converting one or two dimensional optical imformation (e.g., optical image) into an electrical signal. Image sensors may be classified into complementary metal-oxide-semiconductor (CMOS) image sensors and charge coupled devices (CCD) image sensors. CCD image sensors exhibit superior photo-sensitivity and noise properties as compared to CMOS image sensors. CCD image sensors, however, are disadvantageous in view of the difficulty obtaining high-integration and also due to its high power consumption. On the other hand, CMOS image sensors (CIS) are advantageous in that they involve simple processes, are suitability for highly integrated devices and exhibit low power consumption.

Accordingly, the recent rapid progress in semiconductor device fabrication techniques has brought about great improvement in CIS fabrication techniques and properties. As a result, active research is being made on CIS. In CIS research, sensitivity improvement is the most important reaserch subject. In order to enhance sensitivity, it is important to maximize light absorption while minimizing light loss. To realize sensitivity improvement, various factors including the shape of microlenses, the thicknesses of dielectrics and sensitivity of photodiodes must be taken into consideration.

Since general techniques employ color filters made of photoresist materials, they are disadvantages since metals to prevent optical loss cannot be directly deposited on the color filters. Accordingly, there is a limitation in improving sensitivity by isolating color filters from each other.

SUMMARY

Embodiments relate to an image sensor and a method for fabricating the same with enhanced sensitivity.

Embodiments relate to an image sensor and a method for fabricating the same that is suitable for reducing optical loss for the purpose of enhancing sensivity.

Embodiments relate to an image sensor and a method for fabricating the same that enhances sensivity and minimizing optical loss by isolating color filters from each other using a metal that has superior reflection properties, while having no effect on the color filters.

Embodiments relate to an image sensor that may include at least one of the following: a wafer; a plurality of color filters formed on and/or over the wafer; and a plurality of metal film patterns formed between the color filters to isolate the color filters from each other. In accordance with embodiments, the metal film patterns should be composed of a material which exhibits total light reflection. In accordance with embodiments, the image sensor may further include a dielectric layer contacting the metal film patterns.

Embodiments relate to an image sensor that may include at least one of the following: a wafer; first color filters uniformly spaced apart from each other on and/or over the wafer; a dielectric layer formed on and/or over the entire surface of the wafer including the first color filters; metal film patterns formed on and/or over sidewalls of the dielectric layer; and second color filters interposed between the metal film patterns. In accordance with embodiments, the metal films patterns are composed of a material that exhibits total light reflection. In accordance with embodiments, the metal film patterns are composed of at least one of tantalum (Ta) and titamium (Ti). In accordance with embodiments, the second color filters are one of green color filters and red color filters. In accordance with embodiments, the dielectric layer is composed of a low temperature oxide film.

Embodiments relate to a method for fabricating an image sensor that may include at least one of the following steps: forming first color filters on and/or over a wafer; and then forming metal film patterns on and/or over sidewalls of the first color filters; and then forming second color filters such that the respective second color filters are in direct contact with the metal film patterns. In accordance with embodiments, the step of forming the metal film patterns may include at least one of: depositing a dielectric layer on and/or over the entire surface of the wafer including the first color filters; and then depositing a metal film exhibiting total light reflection on and/or over the dielectric layer; and then removing a portion of the metal film provided in a region other than the sidewalls of the dielectric layer. In accordance with embodiments, the dielectric layer is composed of a low temperature oxide film and the metal film is deposited using physical vapor deposition (PVD). In accordance with embodiments, the metal films may be partially removed using blanket etching.

Embodiments relate to a method for fabricating an image sensor that may include at least one of the following steps: forming first color filters on and/or over a wafer such that the first color filters are uniformly spaced apart from each other; and then forming a dielectric layer on and/or over the entire surface of the wafer including the first color filters; and then forming metal film patterns exhibiting total light reflection on and/or over sidewalls of the dielectric layer; and then forming second color filters between the metal film patterns. In accordance with embodiments, the step of forming the metal films may include one of the following: depositing a metal exhibiting total reflection in a serrated form on and/or over the dielectric layer; and then removing the metal deposited in a region other than the inside walls of the grooves in the dielectric layer. In accordance with embodiments, the step of forming the dielectric layer may include depositing a low temperature oxide film on and/or over the entire surface of the wafer including the first color filters. In accordance with embodiments, the metal film patterns are composed of a material which exhibits total light reflection. In accordance with embodiments, the metal film patterns are composed of at least one of tantalum (Ta) and titamium (Ti). In accordance with embodiments, the step of forming the first color filters includes forming blue color filters spaced apart by a predetermined distance on and/or over the wafer.

Embodiments relate to a method that may include at least one of the following steps: forming a plurality of first color filters spaced apart over a wafer; and then forming a low temperature oxide layer over the entire surface of the wafer including the first color filters; forming film patterns which exhibits total reflection of light in spaces between respective first color filters and on sidewalls of the low temperature oxide layer; and then forming second color filters and third color filters in the spaces between respective first color filters and contacting the metal film patterns such that the second color filters and the third color filters are isolated from the first color filters using the film patterns.

DRAWINGS

Figure 6:
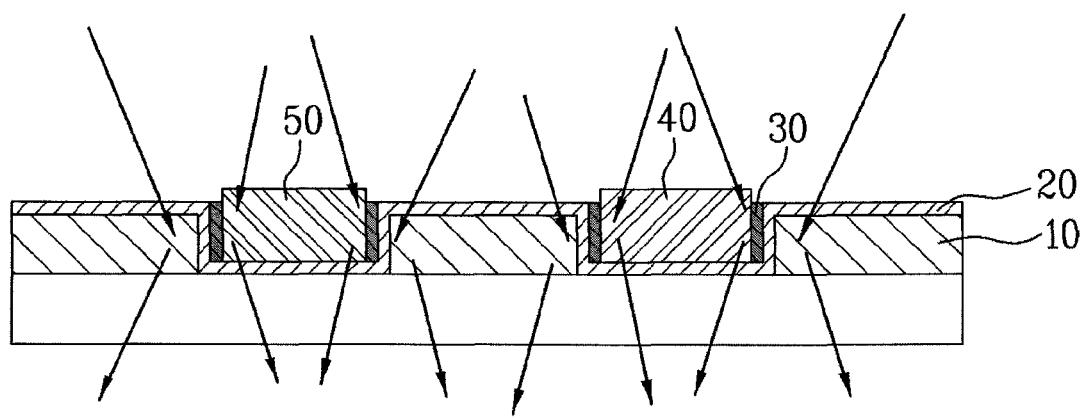

Example FIG. 6 illustrates a phenomenon in which light incident upon the CIS image sensor in accordance with embodiments is totally reflected by a metal film.

DESCRIPTION

Hereinafter, configurations and operations according to embodiments will be described in detail with reference to the accompanying drawings. Although the configurations and functions of embodiments are illustrated in the accompanying drawings, in conjunction with at least one embodiment, and described with reference to the accompanying drawings and the embodiment, the technical idea of embodiments and the important configurations and functions thereof are not limited thereto.

In accordance with embodiments, in order to isolate color filters from each other, a metal film exhibiting total light reflection is formed between the color filters. Prior to forming the metal film, in order to prevent color filters from being damaged, a dielectric layer isolating the color filters from the metal film is formed. As a result, a key aspect of embodiments is to minimize optical loss by isolating color filters from each other using a multi-layered structure including a dielectric layer and a metal film.

Figure 1:
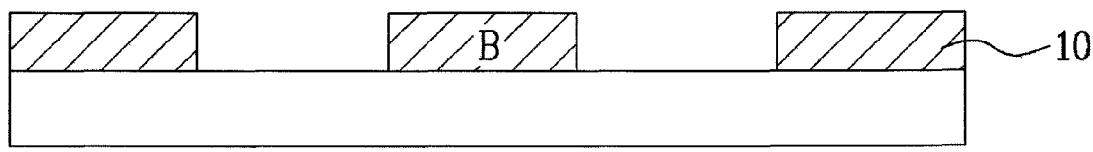
FIG. 1 illustrates a process of forming blue color filters, in accordance with embodiments.

As illustrated in example FIG. 1, color filters 10 (e.g., blue color filters) are formed spaced apart on and/or over a wafer. The wafer may include photodiodes, metal lines and other various films and is to be understood as having the configuration of a general image sensor. Blue color filters 10 are spaced apart from one another by a predetermined distance, such that other color filters, e.g., green color filters and/or red color filter are interposed between blue color filters 10. Meaning, identical color filters are foomed such that they are not adjacent to each other. When seen from the cross-section of a substrate, blue color filters 10 are uniformly spaced, while when seen from the top side of the substrate, blue color filters 10 are in the form of a lattice pattern.

Figure 2:
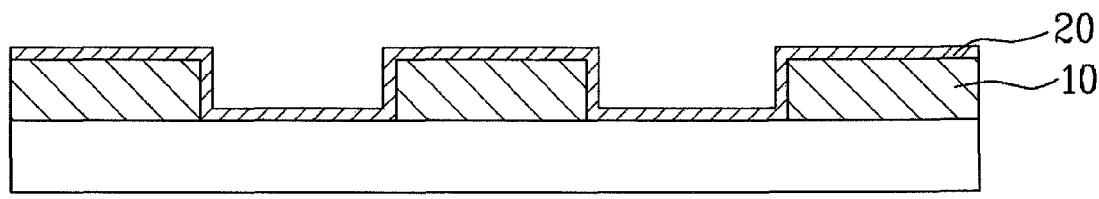
FIG. 2 illustrates a process of forming a dielectric layer, in accordance with embodiments.

After blue color filters 10 are uniformly spaced, metal films are formed on and/or over sidewalls of blue color filters 10 to isolate blue color filters 10 from each other. The metal films may be formed by depositing a metal exhibiting total light reflection using a method selected from physical vapor deposition (PVD), chemical vapor deposition (CVD), atomic layer deposition (ALD), electroplating and electrolysis plating. However, when taking into consideration the fact that color filters are made of phororesists, embodiments preferably uses PVD to deposite the metal films. Since PVD may cause damage to the color filters, the method in accordance with embodiments can avoid directly depositing the metal film on and/or over the color filters and allow for forming dielectric layer 20 as a buffer film prior to forming the metal films. As illustrated in example FIG. 2, after blue color filters (10) are formed, dielectric layer 20 is formed on and/or over the entire surface of the wafer including blue color filters 10. Since blue color filters 10 are uniformly spaced apart from each other, dielectric layer 20 has a serrated form.

Dielectric layer 20 is preferably made of a low temperature oxide. The low temperature oxide film is formed at a temperature of about 180° C. For reference, blue color filters 10 made of photoresists melt at about 200° C. Accordingly, the formation of the low temperature oxide film has no effect on blue color filters 10. In particular, dielectric layer 10, i.e., low temperature oxide film, prevents blue color filters 10 from being damaged upon sputtering to deposite the metal films.

Figure 3:
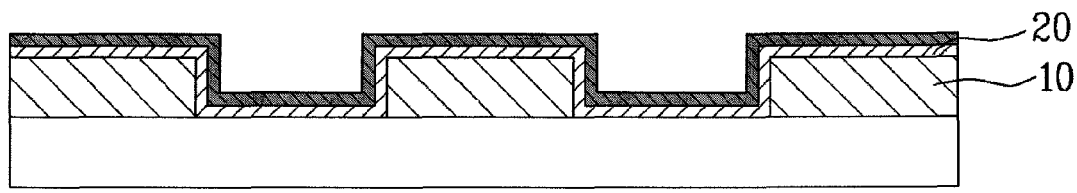
FIG. 3 illustrates a process of depositing a metal layer, in accordance with embodiments.

As illustrated in example FIG. 3, a metal layer exhibiting total light reflection is deposited on and/or over the serrated form of dielectric layer 20. The metal layer represented by a shade depends upon the shape of dielectric layer 20, and thus, also takes a serrated form. The deposited metal may be a metal exhibiting total light reflection. Such a metal may be one of tantalum (Ta) and titanium (Ti).

Figure 4:
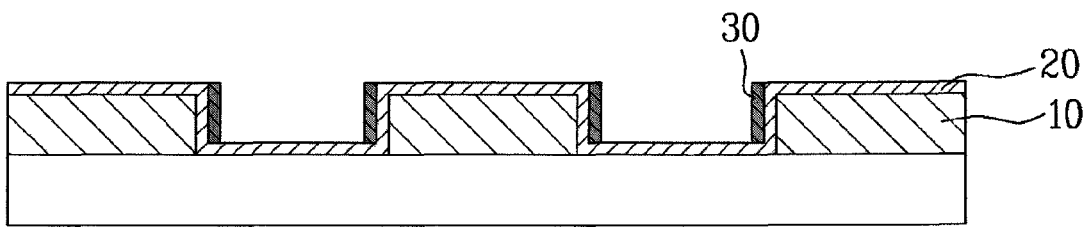
FIG. 4 illustrates a process of forming a metal film pattern to isolate color filters, in accordance with embodiments.

As illustrated in example FIG. 4, the serrated metal layer is partially removed to form metal film patterns 30 that isolate the color filters from each other. Meaning, the metal deposited in a region other than the sidewalls of dielectric layer 20 is removed. More specifically, the metal layer formed on and/or over the uppermost surface of dielectric layer 20 and blue color filters 10 and on and/or over the bottommost surface of dielectric layer 20 is removed. Here, the partial removal of the metal layer is carried out using blanket etching. Furthermore, in accordance with embodiments, it is preferable to completely remove the metal without leaving any residue. As a result, metal film patterns 30 which exhibit total light reflection remain on and/or over sidewalls of dielectric layer 20.

Figure 5:
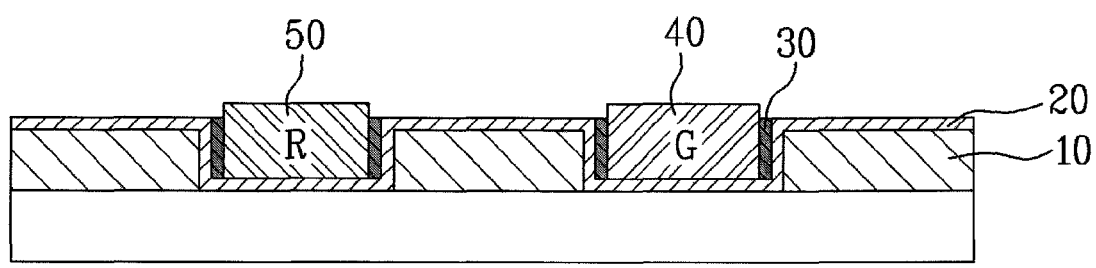
FIG. 5 illustrates a process of forming green color filters and/or red color filters, in accordance with embodiments.

As illustrated in example FIG. 5, green color filters 40 and/or red color filters 50 are formed in spaces between adjacent blue color filters 10 such that they indirectly contact respective blue color filters 40. As a result, green color filters 40 and/or red color filters 50 are formed in grooves of the serrated form provided by dielectric 20, in particular, between metal film patterns 30 formed on the sidewalls of dielectric layer 20. The CIS image sensor in accordance with embodiments includes a plurality of color filters 10, 40 and 50 alternately formed on and/or over a wafer, and metal film patterns 30 formed between color filters 10, 40 and 50 to isolate color filters 10, 40 and 50 form each other.

In accordance with embodiments, one color filter selected from three types of color filters 10, 40 and 50 is first formed on and/or over a wafer. Metal film patterns are then formed and the remaining two color filters are then formed at both sides of the formed color filter, respectively. For example, blue color filters 10 are formed on and/or over a wafer, green color filter 40 is formed at one side of blue color filters (10) and red color filter 50 is formed at the other side thereof. Metal film patterns 30 are formed between color filters 10, 40 and 50. In order to prevent metal film patterns 30 from causing damage to blue color filters 10, dielectric layer 20 is formed on and/or over blue color filters 10 prior to forming metal film patterns 30. Accordingly, dielectric layer 20 acts as a buffer film to isolate from the metal film color filters 10, 40 and 50, and particularly, any color filter first formed on and/or over the wafer. Dielectric layer 20 is formed in a serrated form on and/or over the entire surface including blue color filters 10. The serrated form is caused by blue color filters 10 being spaced apart from each other by a predetermined distance. Accordingly, metal film patterns 30 are formed on and/or over sidewalls of dielectric layer 20. In addition, other than previously formed blue color filters 10, green color filters 40 and/or red color filters 50 are formed between adjacent metal film patterns 30 in the spaces or grooves between color filters 10.

As illustrated in example FIG. 6, illustrated is a phenomenon in which light incident upon the CIS image sensor is totally reflected in a downward direction by metal film patterns 30. Since metal film patterns 30 isolate color filters 10, 40 and 50 from each other, incident light is totally reflected by metal film patterns 30 and collected on a corresponding photodiode, thereby minimizing optical loss. As a result, the image sensor can exhibit enhanced sensitivity.

The method in accordance with embodiments requires a minimized process to deposit the metal film and induces total reflection using metal film patterns, thus enabling considerable enhancement in the sensitivity of the image sensor without negatively affecting an overall process.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a wafer;
   a plurality of color filters formed over the wafer, the color filters including first color filters formed spaced apart on the wafer and second color filters interposed between the first color filters;
   a dielectric layer formed over the entire surface of the wafer including the first color filters; and
   a plurality of metal film patterns formed between the color filters to isolate the color filters from each other,
   wherein the second color filters are formed over the dielectric layer,
   wherein the metal film patterns are formed on sidewalls of the dielectric layer, and
   wherein the metal film patterns are formed spaced apart on the sidewalls of the dielectric layer and the second color filters are formed in the space between the metal film patterns.

2. The image sensor of claim 1, wherein the metal film patterns exhibit total light reflection.

3. The image sensor of claim 1, wherein the first color filters comprise blue color filters.

4. The image sensor of claim 1, wherein the second color filters comprise one of green color filters and red color filters.

5. The image sensor of claim 1, wherein the dielectric layer comprises a low temperature oxide film.

6. The image sensor of claim 1, wherein the metal film patterns are composed of one of tantalum (Ta) or titanium (Ti).

7. The method of claim 1, wherein the metal film comprises one of tantalum (Ta) and titanium (Ti).

8. A method for fabricating an image sensor comprising:
   forming a plurality of first color filters over a wafer;
   depositing a dielectric layer over the entire surface of the wafer including the first color filters;
   depositing a metal film on the dielectric layer;
   forming metal film patterns spaced apart over sidewalls of the first color filters by removing portions of the metal film formed in a region other than the sidewalls of the dielectric layer; and
   forming second color filters in the spaces between the metal film patterns such that the second color filters contact the metal film patterns.

9. The method of claim 8, wherein
   the metal film is composed of a material which exhibits total reflection of light.

10. The method of claim 8, wherein the dielectric layer comprises a low temperature oxide film.

11. The method of claim 8, wherein the metal film is deposited using physical vapor deposition (PVD).

12. The method of claim 8, wherein removing portions of the metal film is performed using blanket etching.

* * * * *